(12) United States Patent
Youn

(10) Patent No.: US 7,477,887 B2
(45) Date of Patent: Jan. 13, 2009

(54) TAG READER MAINTAINING SENSITIVITY WITH ADJUSTABLE TAG INTERROGATION POWER LEVEL

(75) Inventor: Tai Won Youn, Albuquerque, NM (US)

(73) Assignee: TC License Ltd., Wilmington, DE (US)

( * ) Notice: Subject to any disclaimer, the term of this patent is extended or adjusted under 35 U.S.C. 154(b) by 363 days.

(21) Appl. No.: 10/976,880

(22) Filed: Nov. 1, 2004

(65) Prior Publication Data

US 2006/0094392 A1 May 4, 2006

(51) Int. Cl.
*H04Q 1/30* (2006.01)

(52) U.S. Cl. .................. 455/323; 455/127.2; 455/41.2; 340/10.1; 340/572.1

(58) Field of Classification Search ................ 455/323, 455/324, 343.1, 41.2, 318, 319, 255–265, 455/333, 334, 127.2, 232.1, 254; 340/10.2, 340/10.3, 10.1; 375/350, 340, 345, 346
See application file for complete search history.

(56) References Cited

U.S. PATENT DOCUMENTS

| | | | | |
|---|---|---|---|---|
| 4,928,314 A | * | 5/1990 | Grandfield et al. | ....... 455/236.1 |
| 6,639,509 B1 | * | 10/2003 | Martinez | .................... 340/10.4 |
| 7,079,825 B2 | * | 7/2006 | Wieck | ....................... 455/234.1 |
| 2002/0149484 A1 | * | 10/2002 | Carrender | ................. 340/572.4 |
| 2003/0083036 A1 | * | 5/2003 | Liu | .............................. 455/343 |
| 2004/0192244 A1 | * | 9/2004 | Tan et al. | ..................... 455/333 |
| 2004/0203478 A1 | * | 10/2004 | Scott | ............................ 455/70 |

OTHER PUBLICATIONS

"Amplifier Noise Measurement at NIST", D. Wait, et al., IEEE Transactions on Instrumentation and Measurement, vol. 46, No. 2, Apr. 1997.
"Mini-Circuits—Modern Amplifier Terms Defined", updated Dec. 17, 1999.
"Designing Single Stage BJT Amplifier", F. Kung, Apr. 2000, pp. 1-11.

* cited by examiner

*Primary Examiner*—Blane J Jackson
(74) *Attorney, Agent, or Firm*—Caesar, Rivise, Bernstein, Cohen & Pokotilow, Ltd.

(57) ABSTRACT

A method and apparatus for maintaining sensitivity of a homodyne receiver over varying transmitter power levels is disclosed. The method includes adjusting output power levels of a transmitter driver. A bias supply voltage to the transmitter driver may be adjusted to adjust the output power levels. A control voltage to the transmitter driver may be adjusted to adjust the output power levels of the transmitter driver. A homodyne radio frequency tag reader may include the method.

3 Claims, 5 Drawing Sheets

TAG READER MAINTAINING SENSITIVITY WITH ADJUSTABLE TAG INTERROGATION POWER LEVEL

FIELD OF THE INVENTION

The present invention is generally related to radio frequency communication devices and, more particularly, is related to an apparatus and method for maintaining sensitivity of a homodyne receiver over varying transmitter power levels.

BACKGROUND OF THE INVENTION

As large numbers of objects are moved in inventory, product manufacturing and merchandising operation, there is a continuing challenge to accurately manage the location and flow of objects. Additionally, there is a continuing goal to interrogate the location of objects in an inexpensive and streamlined manner. Furthermore, there is a need for tag devices suitably configured to mount to a variety of objects including goods, items, persons, or animals as well as any moving or stationary, animate or inanimate object. One way of tracking objects is with an electronic identification system.

One presently available electronic identification system utilizes a magnetic field modulation system to monitor tag devices. A controller interrogator unit creates a magnetic field that becomes detuned when the tag devices pass through the magnetic field. In some cases, the tag device may be tuned and detuned in a sequence unique to the tag device in order to distinguish between a number of different tags, each having a distinct identification sequence. Typically, the tag devices are entirely passive, eliminating the need for a portable power supply which results in a small and portable package. However, that identification system is only capable of distinguishing a limited number of tag devices, over a relatively short range, limited by the size of the resulting magnetic field. Detuning is the means of encoding the identification number of the tag device or its data.

Another identification system utilizes an RF transponder device affixed to an object to be monitored, in which a controller or interrogator unit transmits an interrogation signal to the device. The device receives the signal, and then generates and transmits a responsive signal. The interrogation signal and the responsive signal are typically radio frequency signals produced by a radio frequency transmitter circuit. Since radio frequency signals can be transmitted over greater distances than magnetic fields, a radio frequency based transponder device tends to be more suitable for applications requiring tracking of a tag device that may not be in close proximity to an interrogator unit. However, when a large number of devices are utilized, the interrogator unit triggers frequent wake up of each device. As a result, responsive signals are frequently generated. In the case of a battery powered device, the life of the battery is severely diminished due to frequent unintentional wake up of the device. Therefore, there is a need to produce tags having different receiver sensitivities, and to produce tags having either factory or user adjustable sensitivities.

Conventional heterodyne receivers down convert a radio frequency signal to a baseband signal using one or more intermediate stages in which the radio frequency signal is converted to one or more intermediate frequency signals, lower than the radio frequency signal, until the baseband frequency is reached. A heterodyne transmitter generates a higher radio frequency signal from a baseband signal using one or more intermediate stages to up convert the frequency. A transceiver provides both transmit and receive components and functions.

A homodyne receiver directly down converts radio frequency signals to baseband frequency without intermediate stages. Analogously, a homodyne transmitter up converts from baseband to radio frequency without intermediate stages. A radio system (frequency conversion stage, tuner, receiver, transmitter, or transceiver) may include homodyne and heterodyne components.

The trend in new radio systems technology receiver/tuner development is predicted to concentrate on moving the radio frequency spectrum down to baseband frequencies where it will be digitized and processed under software control. That will impose even more stringent demands for dynamic range, increased sensitivity, and lower distortion. Reducing size, weight and power consumption to provide longer operating time under battery power, are also concerns for commercial and non-commercial applications. A key system performance challenge involves keeping the spectrum dynamic range (sensitivity versus distortion) as high as possible before digitization and the analog to digital conversion, while maintaining high sensitivity and controlling distortion.

Thus, a need exists in the art to address the aforementioned deficiencies and inadequacies.

SUMMARY OF THE INVENTION

A preferred embodiment of the present invention provides a method and apparatus for maintaining sensitivity of a homodyne receiver over varying transmitter power levels.

Briefly described, a preferred embodiment of the system, among others, can be implemented as follows. In the preferred method, a typical homodyne transceiver may include an oscillator, a radio frequency buffer amplifier, an adjustable gain amplifier (power amplifier driver), a power amplifier (PA) and homodyne receiver. In the preferred method, instead of adjusting the voltage of the power amplifier power supply to vary the transmitter power levels, the output power levels of the adjustable gain amplifier may be adjusted. The output power levels of the adjustable gain amplifier may be adjusted by adjusting a bias supply voltage to the adjustable gain amplifier or adjusting a control voltage to the adjustable gain amplifier.

Embodiments of the present invention can also be viewed as providing an apparatus for maintaining sensitivity over varying transmitter power levels that may be incorporated in a homodyne radio frequency tag reader. The apparatus includes a homodyne receiver using adjustable output power levels in the power amplifier driver.

Other systems, methods, features and advantages of the present invention will become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWING

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION OF THE PREFERRED EMBODIMENT

Figure 1:
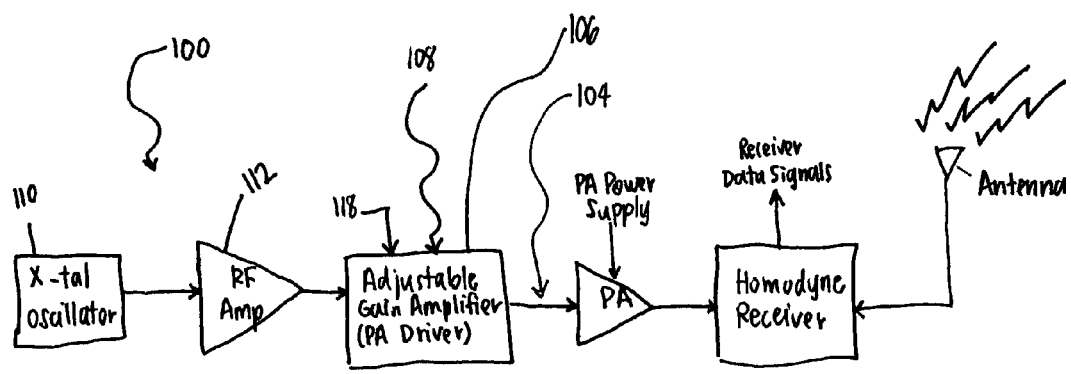
FIG. 1 is a block diagram of a homodyne radio frequency tag reader.

FIG. 1 illustrates a block diagram of a homodyne transceiver 100, including an oscillator 110, a radio frequency (RF) buffer amplifier 112, an adjustable gain amplifier (PA Driver) 106, Power Amplifier (PA) 116, a homodyne receiver 102 and an antenna 114. For a given homodyne receiver sensitivity, the homodyne transceiver requires a PA power output level that is adjustable to a wide range (i.e. 15 db). The homodyne receiver 102 multiplies the incoming receiver signals with the transmitter signal to produce the received data signals, which determine the transceiver sensitivity for each power level. Therefore, transceiver sensitivity degrades as the transmitter signal quality is reduced in terms of the signal-to-noise ratio. In the claimed invention, instead of adjusting the PA power supply voltage 120 to vary transmitter power levels, the output power levels 104 of the adjustable gain amplifier 106 are adjusted. In one approach, the aforementioned may be obtained by adjusting a bias supply voltage 108 to the adjustable gain amplifier 106. In another approach, the present method adjusts a control voltage 118 to the adjustable gain amplifier 106, thus maintaining sensitivity of the homodyne receiver 102 over varying transmitter power levels. Both approaches maintain a fixed power supply voltage 120 to the PA 116 while changing power levels and while also maintaining a high signal-to-noise ratio over the various power level changes.

Figure 2:
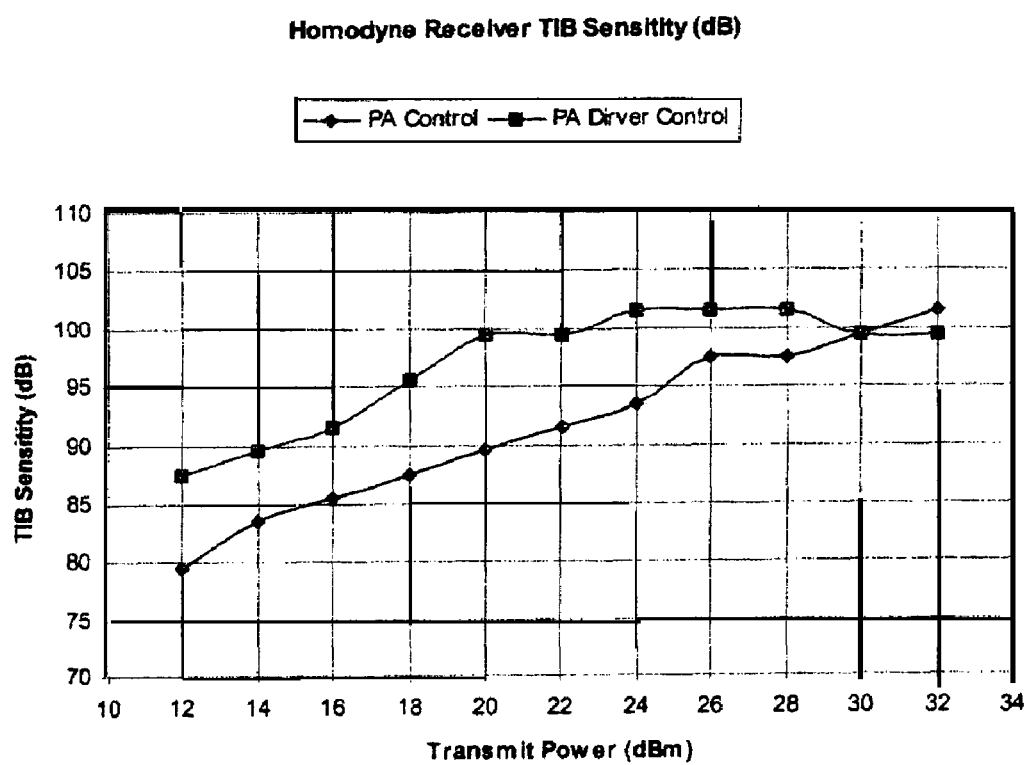
FIG. 2 is a drawing showing a graph of the sensitivity of the homodyne receiver Tag-In-Box (TIB) sensitivity versus the transmit power.

FIG. 2 shows the homodyne receiver Tag-In-Box sensitivity versus the transmit power. Tag-In-Box (TIB) is the receiver signal level in dB compared to the transmit power. For example, Tag-In Box of 100 dB for 32 dBm transmit power means that the receiver signal level is −68 dBm (+32 dBm −100 dB). In the present invention, the PA driver 106 Tag-In-Box sensitivity hardly changes from +32 dBm through +20 dBm of the transmit power, and approximately, linearly decreases from +20 dBm through +10 dBm. FIG. 2 also illustrates that the PA driver control provides a TIB increase of up to +10 dB for the transmit power range of +32 dBm through +10 dBm as compared to that when controlling the PA voltage 120.

Figure 3:
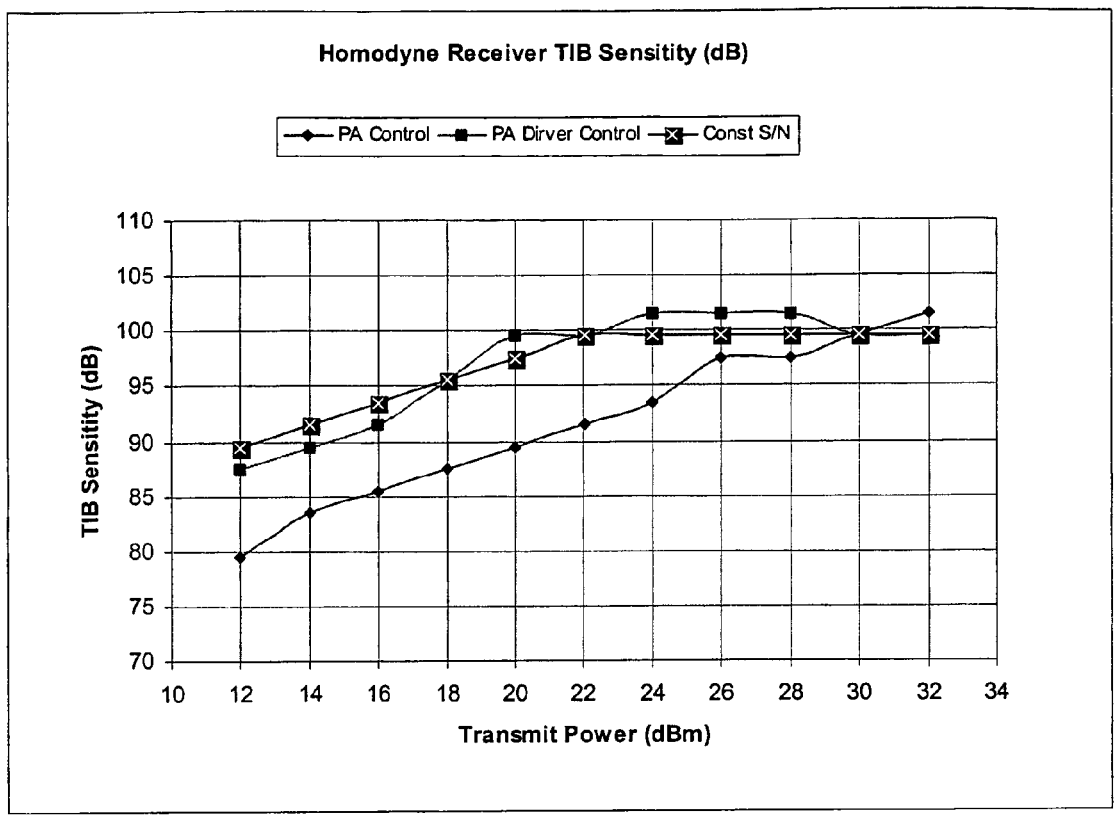
FIG. 3 is a drawing showing a graphical relationship between the power levels of the homodyne receiver and the signal-to-noise ratio.

FIG. 3 shows the relationship of the homodyne receiver power levels versus the signal-to-noise ratio change of the transmit signal. The diodes (not shown) of the homodyne receiver 102 multiply (mix) the transmit signal with the return signal from the tag to produce the receiver data signals. The resultant data signal quality is a non-linear function of the signal quality (signal-to-noise ratio) and the transmit signal level. FIG. 3 shows the constant signal-to-noise curve that represents the TIB sensitivity measured by varying the transmitter power for the given signal-to-noise ratio of the transmit signal. Notice that the PA driver curve approximately follows the constant signal-to-noise curve considering a measurement accuracy of +/−2 dB. The two curves indicate that the signal-to-noise ratio determines the TIB from +32 dBm through +20 dBm, and the transmit level determines the TIB from +20 dBm through +10 dBm. One can conclude, that the TIB sensitivity difference between the constant signal to noise and the PA control voltage is due to the signal-to-noise ratio degradation of the PA control voltage.

With the above-mentioned method of adjusting output power levels of the power amplifier driver (adjustable gain amplifier), a homodyne radio frequency tag reader may maintain sensitivity over varying transmitter power levels by incorporating a homodyne receiver 102.

A homodyne radio frequency tag reader may maintain sensitivity over varying transmitter power levels by incorporating a homodyne receiver 102.

Figure 4A:
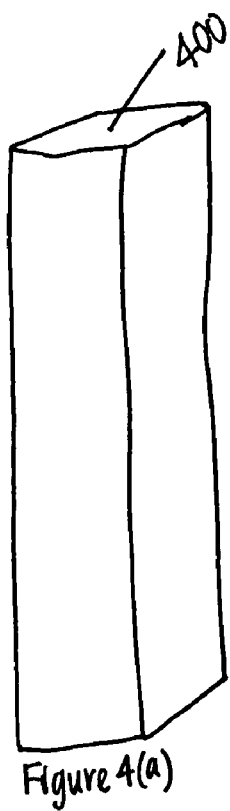
FIG. 4(a) and 4(b) illustrate exemplary tag readers according to non-limiting aspects of the present invention.

FIG. 4(a) provides a non-limiting example of a tag reader according to the present invention. As shown in FIG. 4(a), tag reader 400 may be a large rectangular object. Conveniently, tag reader 400 may be used with another tag reader 400 and positioned at an area where objects bearing RFID tags may pass.

Figure 4B:
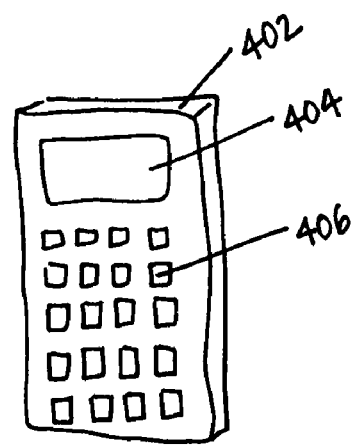

FIG. 4(b) illustrates an exemplary hand-held tag reader according to the present invention. As shown in FIG. 4(b), hand-held tag reader 402 may include screen 404 and keypad 406.

Figure 5:
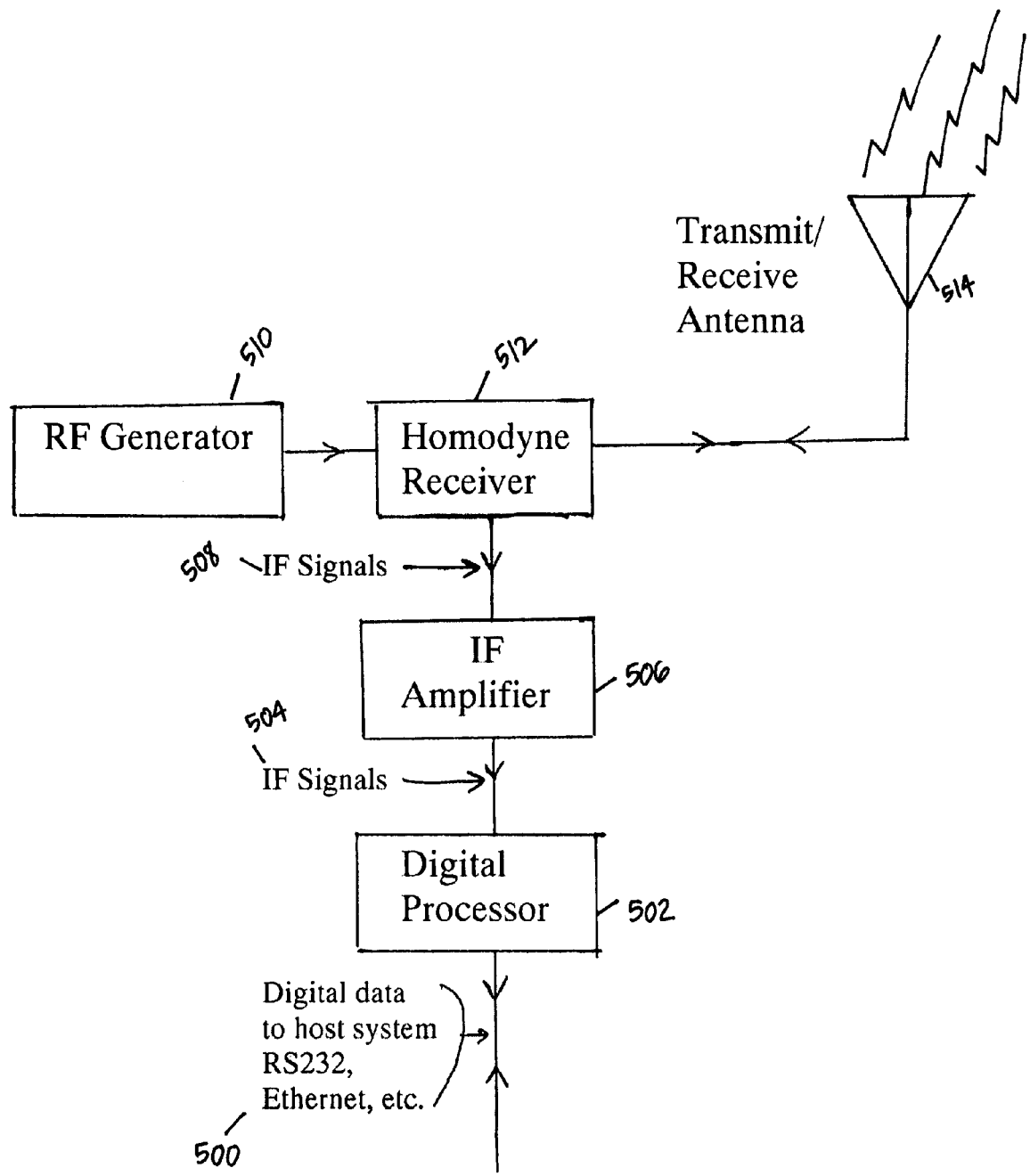
FIG. 5 provides an additional illustration of a block diagram of a tag reader according to non-limiting aspects of the present invention.

FIG. 5 provides an exemplary block diagram of the interior circuitry of a tag reader according to a non-limiting aspect of the present invention. As shown in FIG. 5, RF Generator 510 feeds a signal into homodyne receiver 512. Homodyne receiver 512, in turn, both transmit signals to and receives signals from antenna 514. Homodyne receiver 512 also transmits IF signals 508 to IF amplifier 506. Once through IF amplifier 506, the amplified IF signals 504 are sent through a digital processor 502. Data is exchanged in digital form between the digital processor 502 and the host system over a suitable connection 500. Exemplary connections may include an RS232 connection, an Ethernet connection, or the like.

It should be emphasized that the above described embodiment of the present invention, particularly, any preferred embodiment, are merely possible examples of implementation, merely set forth for a clear understanding of the principles of the invention. Many variations and modifications may be made to the above described embodiment of the invention without departing substantially from the spirit and principles of the invention. All such modifications and variations are intended to be included herein within the scope of this disclosure and the present invention and protected by the following claims.

What is claimed is:

1. In a tag reader system having an adjustable tag interrogation power level, the system comprising:

a single frequency signal provided by a local oscillator;

an amplified frequency signal provided by an RF buffer amplifier which receives and amplifies the single frequency signal;

a varying adjustably amplified frequency signal provided by an adjustable gain amplifier which receives and adjustably amplifies the amplified frequency signal according to a control signal;

a varying interrogation and downconversion signal provided by a power amplifier which receives and amplifies the varying adjustably amplified frequency signal;

a transmit signal provided by an antenna which receives the varying interrogation and downconversion signal and transmits it to a remote tag device;

a receive signal provided by the antenna which receives a response to the transmit signal wherein the receive signal includes data signals in accordance with the remote tag device;

a homodyne receiver (i) receiving the varying interrogation and downconversion signal and applying it to the antenna and (ii) receiving the receive signal directly from the antenna without amplification and mixing the varying interrogation and downconversion signal with the directly applied unamplified receive signal;

a method comprising:

selectably adjusting the gain of the varying adjustably amplified frequency signal thereby adjusting the power level of the transmit signal over a range of approximately 15 dB by adjusting the control signal independently of a receive signal strength measurement and maintaining the sensitivity of the homodyne receiver substantially constant to recover the data signals over the approximately 15 dB range; and whereby the single frequency signal from the local oscillator is used to both (i) interrogate the remote tag device and (ii) downconvert the receive signal to recover the data signals over the approximately 15 dB range.

2. The system for maintaining a sensitivity of a homodyne receiver system according to claim 1, further comprising adjusting the control voltage by adjusting a bias supply voltage to the adjustable gain amplifier.

3. The system for maintaining a sensitivity of a homodyne receiver system according to claim 1, further comprising adjusting a control voltage to the adjustable gain amplifier.

* * * * *